(12) United States Patent
Greuel et al.

(10) Patent No.: US 6,528,985 B1
(45) Date of Patent: Mar. 4, 2003

(54) NON-DESTRUCTIVE TESTING OF PASSIVE COMPONENTS

(75) Inventors: Georg Greuel, Roetgen (DE); Rik Van Ark, Roermond (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/704,588

(22) Filed: Nov. 2, 2000

(30) Foreign Application Priority Data

Nov. 3, 1999 (DE) .......................................... 199 52 899

(51) Int. Cl.⁷ .................... G01R 31/02; G01N 27/60; G01N 29/00
(52) U.S. Cl. .................... 324/158.1; 324/420; 324/456; 73/587

(58) Field of Search .............................. 324/726, 456, 324/207.21, 207.13, 547, 158.1, 420; 73/587

(56) References Cited

U.S. PATENT DOCUMENTS

| | | | | |
|---|---|---|---|---|
| 5,280,725 A | * | 1/1994 | Stengel | 73/761 |
| 5,510,719 A | | 4/1996 | Yamamoto | 324/548 |
| 5,530,366 A | * | 6/1996 | Nasrallah | 324/547 |
| 6,236,025 B1 | * | 5/2001 | Berkcan | 73/587 |

* cited by examiner

*Primary Examiner*—N. Le
*Assistant Examiner*—Anjan K. Deb
(74) *Attorney, Agent, or Firm*—Ernestine C. Bartlett

(57) ABSTRACT

A device and a method for the non-destructive testing of passive components by applying an electrical test signal to passive components and an acoustic emission is measured by a microphone and, the measured signal is applied to an evaluation unit.

13 Claims, 2 Drawing Sheets

NON-DESTRUCTIVE TESTING OF PASSIVE COMPONENTS

BACKGROUND OF THE INVENTION

The invention relates to a device and a method for the non-destructive testing of passive components.

Quality control is an important aspect of the manufacture of components. Components to be tested are subjected to test loads for an appropriate period of time in order to detect defects. The electrical quantities that can be measured at the contacts of the components are used for evaluation. Defects inside components can also be detected by using X-rays or ultrasound.

U.S. Pat. No. 5,510,719 describes a method of testing capacitors. To this end, a test voltage is applied to a capacitor which is loaded for a given period of time at a relevant temperature. A residual voltage, which lies below a threshold voltage, is used as a criterion for quality evaluation. This residual voltage is measured at the contacts of the capacitor.

According to the described method an electrical response on the contacts of the component to be tested is checked.

The methods that are known thus far have the drawback that carrying out such a test usually requires a significant amount of work. Moreover, the known methods involve the risk that components of inferior quality are completely destroyed by the test.

A further, external test signal is applied to the component for the testing by means of X-rays or ultrasound. This requires an additional implementation of, for example an X-ray source or an ultrasound source.

SUMMARY OF THE INVENTION

Therefore, it is an object of the invention to provide a device and a method offering a simple, reliable evaluation of the failure tolerance of the component to be tested.

This object is achieved by measuring an acoustic emission by a component which is subjected to an electrical test signal.

In the context of the normal test an electrical test signal is applied to the contacts of the component to be tested. This test is intended to test, for example the functional basic properties, such as the resistance or capacitance, of the component. Internal defects of the component convert such properties into oscillations which can be measured as an acoustic emission. The frequency spectrum of faulty components deviates significantly from the frequency spectrum of high-quality components. A decision as regards the quality of the tested component is taken on the basis of this difference.

The acoustic emission can be measured by means of a microphone which is arranged in the direct vicinity of the component. The measured signal is applied to an evaluation unit in which a comparison can be performed by way of spectral analysis, the comparison result being used, for example, to control a sorting machine.

Depending on the type of component, a test voltage or a test current is applied to the terminals of the components to be tested.

It is particularly advantageous to use a test signal in the form of a pulse voltage. The electrical field then arising exerts forces on stationary and moving charge carriers. This effect is particularly pronounced in the case of ferroelectric materials such as used in a variety of electrical components, for example, in non-linear resistors or ferroelectric capacitors. Ferroelectric materials have a high dielectric constant and their response to external electrical fields takes the form of a shift of domain walls. In turn this shift induces mechanical stresses in the material which, when they exceed a threshold value, may cause cracks and/or delaminations. The electrical properties of the components can then still be within a specific range. Latent damage in the form of cracks or delaminations, however, represents a potential risk for premature failure of the component. For example, the breakdown strength is then usually reduced. When exposed to electrical, mechanical or atmospheric stress (temperature, moisture) for a prolonged period of time, faults occur (for example, short-circuits).

In the case of internal defects of the components, the relevant test voltage of suitable shape, magnitude and duration induces the formation of cracks in faulty components. The resultant acoustic emission enables the detection of the cracking and ultimately of a component of inferior quality. A test voltage in the form of a direct voltage or an alternating voltage can be used as necessary.

In the case of passive components, consisting of ferroelectric or ferromagnetic or electrostrictive or magnetostrictive materials, the method according to the invention offers a reliable evaluation of the quality of the component to be tested.

The device according to the invention and the application of such a method are particularly suitable for the testing of resistors and capacitors.

Because the components are normally tested by means of test voltages or test currents in automatic testing devices, the device and the method according to the invention can be readily implemented in the quality control or the test procedure for the output check as well as for the input check.

It is an advantage of the invention that an automatic testing device need not be additionally equipped with special apparatus for controlling the samples. Moreover, the acoustically measurable emission can be simply detected. For the testing of components where a partial discharge, impedance spectra or resonance shifts are measured it has been found that the measurement of an electrical response on the terminals of the component is significantly more intricate.

The means for carrying out this test can be simply integrated in existing automatic testing devices. When X-rays or ultrasound are used for fault detection, such a simple implementation is not possible. The non-destructive testing constitutes a further advantage. Only components of inferior quality respond by cracking or delamination when subjected to a pulse-like test signal. The properties of components of high quality are not influenced by such loading.

BRIEF DESCRIPTION OF THE DRAWINGS

In the drawing.

The invention will now be described in detail with reference to the figures of the drawing.

DETAILED DESCRIPTION OF THE INVENTION

Figure 1:
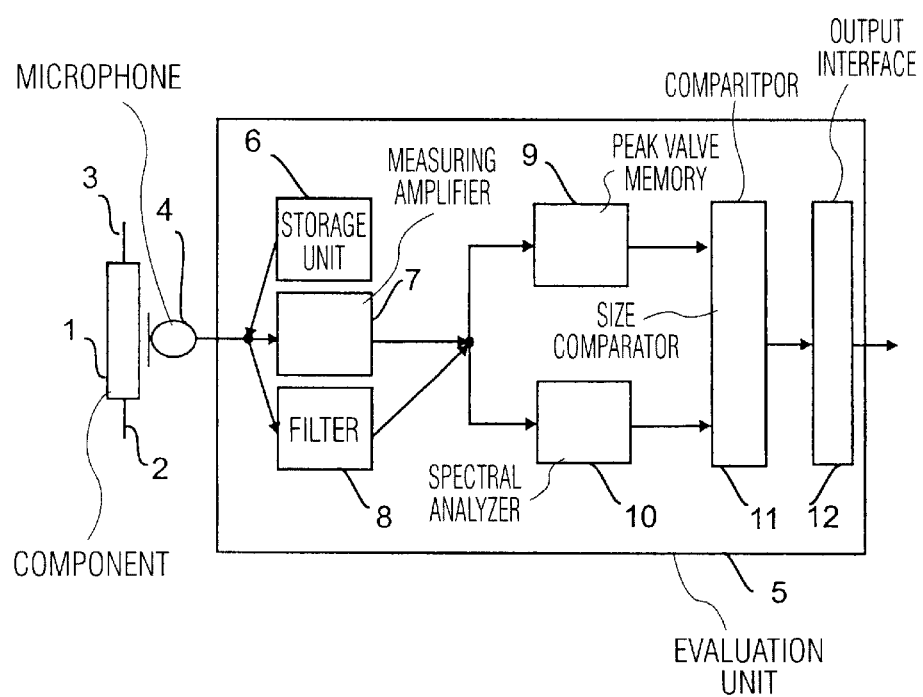
FIG. 1 shows diagrammatically an arrangement according to the invention.

FIG. 1 shows a component 1 and its terminals 2 and 3 via which the electrical test signals are applied in the form of voltage pulses. The electrical field and the resultant mechanical stresses induce a shift of the domain walls; this leads to the formation of cracks in components of inferior quality. Upon such formation of cracks the component 1 outputs an emission which can be acoustically measured. Such an acoustic emission is picked up by a microphone 4 which is arranged adjacent the component 1; it is applied to the evaluation unit 5. The evaluation unit 5 includes a control unit 6 for the microphone 4, a measuring amplifier 7 and a filter 8, a peak value memory 9, a spectral analyzer 10 and a comparator 11 with an output interface 12.

The microphone 4 is controlled by the control unit 6. Signals picked up by the microphone 4 are applied to the measuring amplifier 7 and/or the filter 8. The amplified and filtered signal is applied to the peak value memory 9 and the spectral analyzer 10. The spectral analyzer carries out an FFT (Fast Fourier Transformation). The comparator 11 compares the frequency spectrum of the relevant signal with frequency spectra acquired during the acoustic emission by high-quality components.

Figure 2:
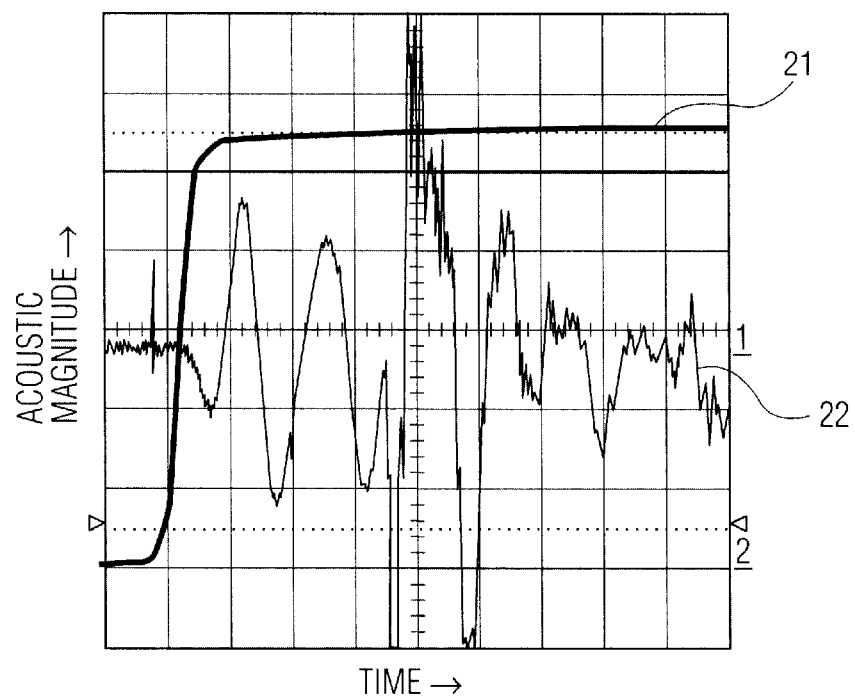
FIG. 2 shows diagrammatically the acoustic emission of a component of inferior quality.

FIG. 2 shows the variation of the test voltage 21 and that of the acoustic signal 22 of a component of inferior quality.

Figure 3:
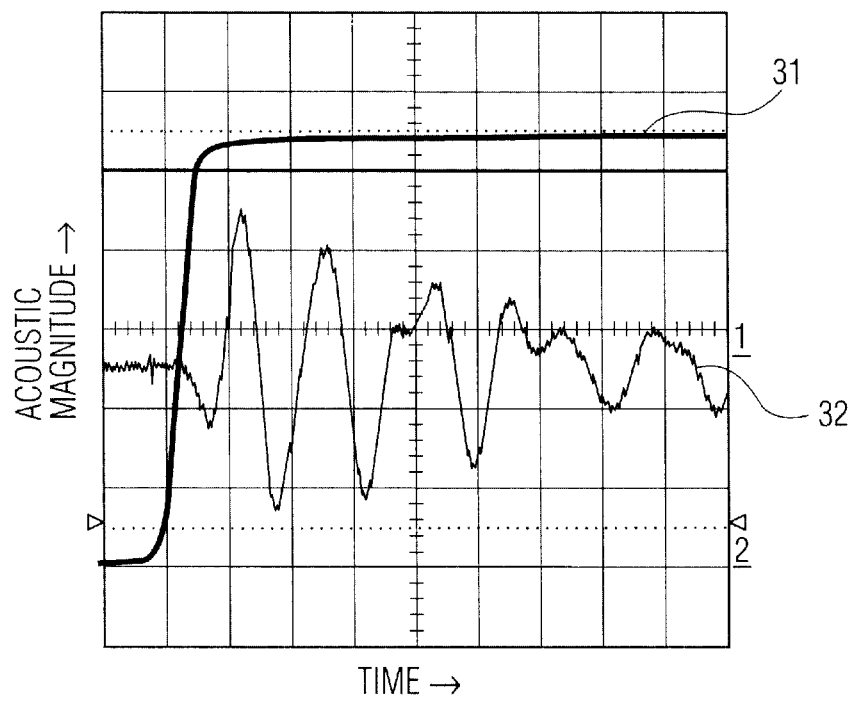
FIG. 3 shows the acoustic emission of a component of high quality.

FIG. 3 shows the variation of the test voltage 31 and that of the acoustic signal 32 of a component of high quality. The acoustic signal 22 of the component of inferior quality clearly deviates from the acoustic signal 32 of a component of high quality.

These differences are detected in the comparator 11 and applied, via the output interface 12, to relevant controls for, for example, sorting machines.

What is claimed is:

1. A device for the non-destructive testing of a passive electrical component comprising terminals, said device comprising means for applying an electrical test signal to the terminals and means for measuring a resultant acoustic emission by the component.

2. A device as claimed in claim 1, wherein the means for measuring the acoustic emission is a microphone.

3. A device as claimed in claim 2, wherein the device comprises means for evaluating a value of the measurement of the acoustic emission.

4. A device as claimed in claim 3 wherein the passive electrical component is a capacitor.

5. A device as claimed in claim 3 wherein the passive electrical component is a resistor.

6. A method for the non-destructive testing of a passive electrical component comprising applying an electrical test signal to terminals of the passive electrical component, measuring a resultant acoustic emission by the component by means of a microphone and applying the measured value of the acoustic emission to an evaluation unit.

7. A method as claimed in claim 6, characterized in that an alternating voltage and/or a direct voltage is applied to the component.

8. A method as claimed in claim 6, characterized in that the acoustic emission is measured on a ferroelectric component which is subjected to test signals.

9. A method as claimed in claim 6, characterized in that the acoustic emission is measured on a ferromagnetic component which is subjected to test signals.

10. A method as claimed in claim 6, characterized in that the acoustic emission is measured on a magnetostrictive component which is subjected to test signals.

11. A method as claimed in claim 6, characterized in that the acoustic emission is measured on an electrostrictive component which is subjected to test signals.

12. A method as claimed in claim 6 wherein the passive electrical component is a capacitor.

13. A method as claimed in claim 6 wherein the passive electrical component is a resistor.

\* \* \* \* \*